US012787772B2

(12) United States Patent
Long et al.

(10) Patent No.: US 12,787,772 B2

(45) Date of Patent: Nov. 3, 2026

(54) PACKAGE WITH ELECTRICALLY INSULATING AND THERMALLY CONDUCTIVE LAYER ON TOP OF ELECTRONIC COMPONENT

(71) Applicant: Infineon Technologies AG, Neubiberg (DE)

(72) Inventors: Shih Kien Long, Melaka (MY); Chee Pin Haw, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 316 days.

(21) Appl. No.: 18/243,751

(22) Filed: Sep. 8, 2023

(65) Prior Publication Data

US 2024/0105544 A1 Mar. 28, 2024

(30) Foreign Application Priority Data

Sep. 28, 2022 (DE) ..................... 10 2022 125 009.1

(51) Int. Cl.

*H10W 40/25* (2026.01)
*H10W 70/40* (2026.01)
*H10W 72/00* (2026.01)
*H10W 74/01* (2026.01)
*H10W 74/10* (2026.01)

(Continued)

(52) U.S. Cl.

CPC ....... *H10W 40/258* (2026.01); *H10W 70/417* (2026.01); *H10W 74/016* (2026.01); *H10W 74/111* (2026.01); *H10W 76/01* (2026.01); *H10W 90/00* (2026.01); *H10W 72/07554* (2026.01); *H10W 72/865* (2026.01); *H10W 72/884* (2026.01); *H10W 90/736* (2026.01);

(Continued)

(58) Field of Classification Search

CPC ................. H01L 23/42; H01L 23/4334; H01L 23/49562; H01L 23/49575; H01L 24/48; H01L 24/73; H10W 70/417; H10W 70/481; H10W 90/736; H10W 90/753; H10W 90/756; H10W 90/00; H10W 72/07554; H10W 72/865; H10W 72/884; H10W 72/30; H10W 72/851; H10W 40/70; H10W 40/778; H10W 90/811

See application file for complete search history.

(56) References Cited

U.S. PATENT DOCUMENTS

| | | | |
|---|---|---|---|
| 8,338,935 | B2 | 12/2012 | Liu et al. |
| 9,941,146 | B2 | 4/2018 | Rusli |

(Continued)

FOREIGN PATENT DOCUMENTS

| | | |
|---|---|---|
| DE | 10 2019 218 157 | 5/2021 |
| WO | 2017/123870 | 7/2017 |

*Primary Examiner* — Marc-Anthony Armand

(74) *Attorney, Agent, or Firm* — Dicke, Billig & Czaja, PLLC

(57) ABSTRACT

A package is disclosed. In one example, the package comprises a carrier, an electronic component mounted on or above the carrier, an electrically insulating and thermally conductive layer on at least part of an upper main surface of the electronic component, and a metal block on the electrically insulating and thermally conductive layer. An encapsulant at least partially encapsulates the electronic component, the carrier, the electrically insulating and thermally conductive layer and the metal block so that an upper main surface of the metal block is exposed beyond the encapsulant.

16 Claims, 3 Drawing Sheets

(51) Int. Cl.
*H10W 76/01* (2026.01)
*H10W 90/00* (2026.01)

(52) U.S. Cl.
CPC ........ *H10W 90/753* (2026.01); *H10W 90/756* (2026.01)

(56) References Cited

U.S. PATENT DOCUMENTS

| | | | | |
|---|---|---|---|---|
| 9,972,576 | B2 | 5/2018 | Otremba et al. | |
| 9,984,960 | B2 | 5/2018 | Hwang et al. | |
| 11,296,051 | B2 | 4/2022 | Kao et al. | |
| 2008/0128879 | A1 | 6/2008 | Takiar et al. | |
| 2018/0122720 | A1* | 5/2018 | Hable | H10W 40/22 |
| 2020/0402883 | A1* | 12/2020 | Kim | H10W 40/22 |

* cited by examiner

PACKAGE WITH ELECTRICALLY INSULATING AND THERMALLY CONDUCTIVE LAYER ON TOP OF ELECTRONIC COMPONENT

CROSS-REFERENCE TO RELATED APPLICATION

This Utility Patent Application claims priority to German Patent Application No. 10 2022 125 009.1 filed Sep. 28, 2022, which is incorporated herein by reference.

BACKGROUND

Technical Field

Various embodiments relate generally to a package, and a method of manufacturing a package.

Description of the Related Art

A conventional package may comprise an electronic component mounted on a chip carrier such as a leadframe, may be electrically connected by a bond wire extending from the chip to the chip carrier or to a lead, and may be molded using a mold compound as an encapsulant.

Thermal reliability of a conventional package may be an issue.

SUMMARY

There may be a need for a package with high thermal reliability and reasonable or low manufacturing effort.

According to an exemplary embodiment, a package is provided which comprises a carrier, an electronic component mounted on or above the carrier, an electrically insulating and thermally conductive layer on at least part of an upper main surface of the electronic component, a metal block on the electrically insulating and thermally conductive layer, and an encapsulant at least partially encapsulating the electronic component, the carrier, the electrically insulating and thermally conductive layer and the metal block so that an upper main surface of the metal block is exposed beyond the encapsulant.

According to another exemplary embodiment, a method of manufacturing a package is provided, the method comprising mounting an electronic component on or above a carrier, providing an electrically insulating and thermally conductive layer on at least part of an upper main surface of the electronic component, providing a metal block on the electrically insulating and thermally conductive layer, and at least partially encapsulating the electronic component, the carrier, the electrically insulating and thermally conductive layer and the metal block by an encapsulant so that an upper main surface of the metal block is exposed beyond the encapsulant.

According to an exemplary embodiment, an encapsulated package comprises an electronic component mounted on or above a carrier and having an electrically insulating and thermally conductive layer with a top-sided metal block on top of the electronic component. The metal block may be exposed beyond the encapsulant for enhanced heat removal. Advantageously, such a package architecture enables a high thermal performance, since heat generated by the electronic component during operation of the package may be efficiently removed along a top-sided heat dissipation part from the electronic component via the electrically insulating and thermally conductive layer and the metal block out of the encapsulant (which may have a relatively low thermal conductivity) of the package. In addition, also the carrier on which the electronic component is assembled may contribute to a heat removal to the bottom side. Further advantageously, the dielectric properties of the electrically insulating and thermally conductive layer on top of the electronic component decouples the electronic component electrically from the exposed metallic surface of the metal block, thereby ensuring also a high electric reliability.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
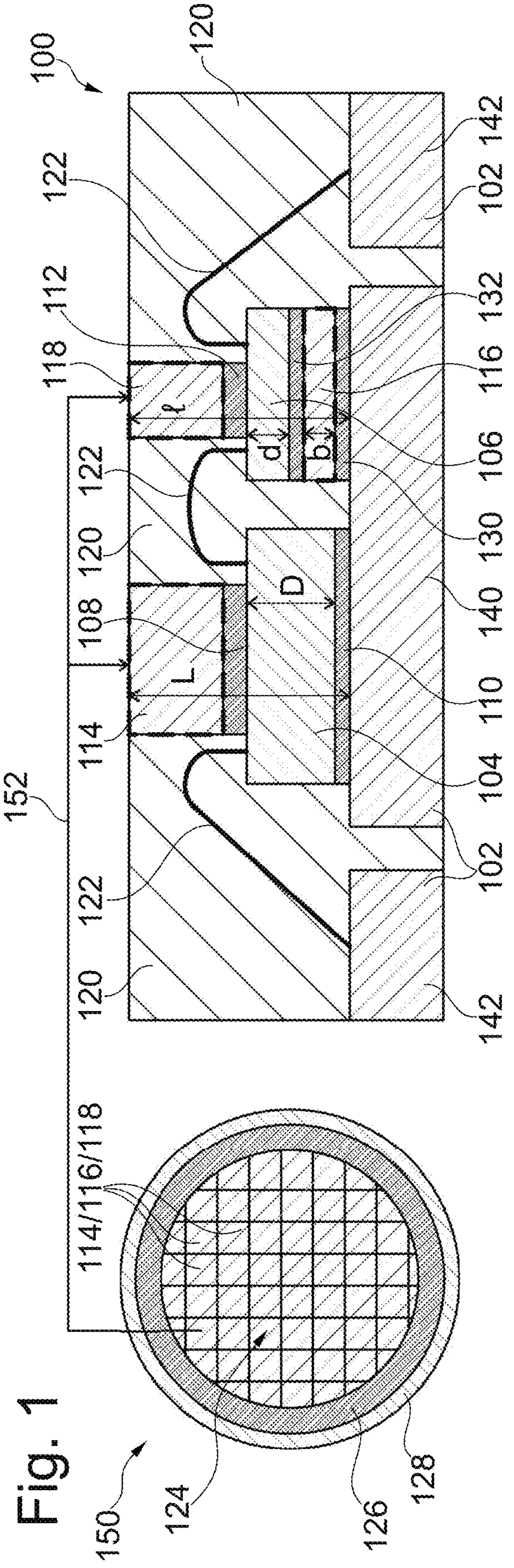
FIG. 1 illustrates a cross-sectional view of a package according to an exemplary embodiment.

According to an exemplary embodiment, a package is provided which comprises a carrier, an electronic component mounted on or above the carrier, an electrically insulating and thermally conductive layer on at least part of an upper main surface of the electronic component, a metal block on the electrically insulating and thermally conductive layer, and an encapsulant at least partially encapsulating the electronic component, the carrier, the electrically insulating and thermally conductive layer and the metal block so that an upper main surface of the metal block is exposed beyond the encapsulant.

According to another exemplary embodiment, a method of manufacturing a package is provided, the method comprising mounting an electronic component on or above a carrier, providing an electrically insulating and thermally conductive layer on at least part of an upper main surface of the electronic component, providing a metal block on the electrically insulating and thermally conductive layer, and at least partially encapsulating the electronic component, the carrier, the electrically insulating and thermally conductive layer and the metal block by an encapsulant so that an upper main surface of the metal block is exposed beyond the encapsulant.

According to an exemplary embodiment, an encapsulated package comprises an electronic component mounted on or above a carrier and having an electrically insulating and thermally conductive layer with a top-sided metal block on top of the electronic component. The metal block may be exposed beyond the encapsulant for enhanced heat removal. Advantageously, such a package architecture enables a high thermal performance, since heat generated by the electronic component during operation of the package may be efficiently removed along a top-sided heat dissipation part from the electronic component via the electrically insulating and thermally conductive layer and the metal block out of the encapsulant (which may have a relatively low thermal conductivity) of the package. In addition, also the carrier on which the electronic component is assembled may contribute to a heat removal to the bottom side. Further advantageously, the dielectric properties of the electrically insulating and thermally conductive layer on top of the electronic component decouples the electronic component electrically from the exposed metallic surface of the metal block, thereby ensuring also a high electric reliability.

DESCRIPTION OF FURTHER EXEMPLARY EMBODIMENTS

In the following, further exemplary embodiments of the package and the method will be explained.

In the context of the present application, the term "package" may particularly denote an electronic device which may comprise one or more electronic components mounted on a (in particular electrically conductive) carrier. Said constituents of the package may be encapsulated at least partially by an encapsulant. Optionally, one or more electrically conductive interconnect bodies (such as metallic pillars, pumps, bond wires and/or clips) may be implemented in a package, for instance for electrically coupling and/or mechanically supporting the electronic component.

In the context of the present application, the term "carrier" may particularly denote a support structure (which may be at least partially electrically conductive) which serves as a mechanical support for the electronic component(s) to be mounted thereon, and which may also contribute to the electric interconnection between the electronic component (s) and the periphery of the package. In other words, the carrier may fulfil a mechanical support function and an electric connection function. A carrier may comprise or consist of a single part, multiple parts joined via encapsulation or other package components, or a subassembly of carriers. When the carrier forms part of a leadframe, it may be or may comprise a die pad. For instance, such a carrier may be a leadframe structure (for instance made of copper), a DAB (Direct Aluminum Bonding) substrate, a DCB (Direct Copper Bonding) substrate, etc. Moreover, the carrier may also be configured as Active Metal Brazing (AMB) substrate. Also at least part of the carrier may be encapsulated by the encapsulant, together with the electronic component.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). However, in other embodiments, the electronic component may also be of different type, such as a mechatronic member, in particular a mechanical switch, etc. In particular, the electronic component may be a semiconductor chip having at least one integrated circuit element (such as a diode or a transistor in a surface portion thereof. The electronic component may be a bare die or may be already packaged or encapsulated. Semiconductor chips implemented according to exemplary embodiments may be formed in silicon technology, gallium nitride technology, silicon carbide technology, etc.

In the context of the present application, the term "electrically insulating and thermally conductive layer" may particularly denote a planar dielectric film or foil being configured for conducting heat. For example, thermal conductivity of the electrically insulating and thermally conductive layer may be at least 1 W/mK, in particular at least 2 W/mK, preferably at least 5 W/mK. For example, the thermal conductivity of the electrically insulating and thermally conductive layer may be in a range from 1 W/mK to 20 W/mK, in particular in a range from 2 W/mK to 12 W/mK. The thermal conductivity of a dielectric matrix of the electrically insulating and thermally conductive layer may be increased by embedding filler particles with higher thermal conductivity (for example ceramic filler particles comprising aluminum oxide, aluminum nitride, boron nitride, silicon oxide, etc.). For example, an electrically insulating and thermally conductive layer may comprise a polymer matrix, optionally having ceramic filler particles therein. For example, an electrically insulating and thermally conductive layer may have a thickness in a range from 1 μm to 200 μm, in particular in a range from 10 μm to 80 μm. For example, an electrically insulating and thermally conductive layer may be sticky or adhesive.

In the context of the present application, the term "metal block" may particularly denote a body comprising a metallic material. In particular, a metal block may consist of a metal, such as copper or aluminum. For instance, a metal block may be a separated section of a metal plate. In an embodiment, a metal block may have a plate shape or a cuboid shape. For example, thermal conductivity of the metal block may be at least 10 W/mK, in particular at least 50 W/mK, preferably at least 100 W/mK. For example, a metal block may have a thickness in a range from 100 μm to 1000 μm, in particular in a range from 200 μm to 300 μm.

In the context of the present application, the term "encapsulant" may particularly denote a substantially electrically insulating material surrounding at least part of an electronic component and at least part of a carrier to provide mechanical protection, electrical insulation, and optionally a certain contribution to heat removal during operation. In particular, said encapsulant may be a mold compound. A mold compound may comprise a matrix of flowable and hardenable material and filler particles embedded therein. For instance, filler particles may be used to adjust the properties of the mold component, in particular to enhance thermal conductivity. As an alternative to a mold compound (for example on the basis of epoxy resin), the encapsulant may also be a potting compound (for instance on the basis of a silicone gel).

In an embodiment, a lower main surface and/or a side surface of the carrier is exposed beyond the encapsulant. By exposing also part of the surface of the carrier with respect to the encapsulant (which may have relatively poor thermal conductivity), a further efficient cooling path may be established at the bottom side of the electronic component. Hence, this may enable double-sided cooling and may therefore ensure an excellent thermal performance of the package. Preferably, the carrier may be made at least partially of a metal and/or may be made at least partially of a ceramic, which may both have a pronounced thermal conductivity.

In an embodiment, the package comprises another (for instance electrically insulating or electrically conductive) thermally conductive layer on at least part of a lower main surface of the electronic component. Thus, both opposing main surfaces of the electronic component may be covered at least partially with a thermally conductive layer. This may ensure a proper thermal coupling on both sides of the electronic component, which may efficiently promote heat dissipation during operation. At the same time, both main surfaces of the electronic component may be electrically decoupled along the heat removal path which may enhance the electric reliability of the package.

In an embodiment, the package comprises a further electronic component mounted on or above the carrier, a further electrically insulating and thermally conductive layer on at least part of an upper main surface of the further electronic component, and a further metal block on the further electrically insulating and thermally conductive layer, wherein the encapsulant at least partially encapsulates the further electronic component, the further electrically insulating and thermally conductive layer and the further metal block so that an upper main surface of the further metal block is exposed beyond the encapsulant. Such an embodiment is shown for instance in FIG. 1. Thus, it may be possible to encapsulate more than one electronic component in the encapsulant. The electronic component may be mounted on the same carrier or on another carrier of the package. By providing at least one further electronic component with a top-sided electrically insulating and thermally conductive layer, top-sided cooling by a respective exposed metal block arranged on top of the respective electrically insulating and thermally conductive layer may be achieved for each electronic component. Hence, continuous thermal paths may be created in such a multi-component package from the respective electronic component via the assigned electrically insulating and thermally conductive layer, and the assigned metal block to the exterior of the package. Also for the at least one additional electronic component, the electrically insulating and thermally conductive layer may additionally ensure a reliable electric decoupling of said additional electronic component with respect to an exterior of the package.

In an embodiment, the package comprises a further electronic component mounted on or above the carrier, wherein the electrically insulating and thermally conductive layer is arranged on at least part of an upper main surface of the further electronic component, and wherein the encapsulant at least partially encapsulates the further electronic component. Preferably, the partially exposed metal block on the electrically insulating and thermally conductive layer promotes thermal coupling of both the electronic component and the further electronic component with an exterior of the package. Such an embodiment is shown for example in FIG. 2. The described embodiment has the same advantages as the previously described embodiment and provides the additional advantage that a single common continuous electrically insulating and thermally conductive layer and a single common continuous metal block thereon may be used for thermally coupling and electrically decoupling a plurality of electronic components with respect to an environment of the package. This renders the manufacturing process particularly simple and further improves the thermal performance.

In an embodiment, the package comprises another metal block between the carrier and the further electronic component for at least partially leveling a height difference between the electronic component and the further electronic component. Correspondingly, the method may comprise mounting another metal block with at least one other (for example electrically insulating or electrically conductive) thermally conductive layer, thereon and/or thereunder on the carrier, mounting a further electronic component on or above the other metal block, and selecting the other metal block with the at least one other thermally conductive layer thereon and/or thereunder for leveling a height difference between the electronic component and the further electronic component. In some configurations, different electronic components mounted on the same carrier and encapsulated in the same encapsulant may have different thicknesses. By providing a thickness balancing additional metal block below (or above) the thinner electronic component, the thickness difference between the electronic components may be compensated partially or entirely. This has advantages: On the one hand, this may allow to expose metal blocks on top of the at least two electronic components at the same vertical level which may lead to an exterior planar main surface of the package without compromising what concerns the thermal performance (see for example FIG. 1). On the other hand, this may also simplify use of a common stack of thermally conductive layer and metal block for at least two electronic components of the same package (compare FIG. 2). The leveling effect of the other metal block may be partially (so that a reduced height difference remains) or entirely (so that no height difference remains).

In an embodiment, the package comprises still another at least one (for example electrically insulating or electrically conductive) thermally conductive layer. The latter may be arranged between the carrier and the other metal block and/or between the other metal block and the further electronic component. Hence, at least one other thermally conductive layer may cover at least one of two opposing main surfaces of the other metal block. This may ensure a continuous thermally conductive path from the carrier up to the one or more metal blocks being exposed beyond the encapsulant. Simultaneously, this may ensure a proper electric decoupling between the at least one further electronic component and the carrier. Thus, a further enhancement of thermal performance and electric reliability may be achieved.

In an embodiment, the package comprises at least one electrically conductive connection element electrically connecting the upper main surface of the electronic component with the carrier and/or with a further electronic component of the package. For example, the carrier may comprise a die paddle for mounting the one or more electronic components and at least one lead. A respective electrically conductive coupling element may electrically couple the at least one electronic component with the die paddle and/or with the at least one lead and/or with at least one further component. Such an electrically conductive coupling element may be a clip, a bond wire or a bond ribbon. A clip may be a curved electrically conductive body accomplishing an electric connection with a high connection area to an upper main surface of a respective electronic component. Additionally or alternatively to such a clip, it is also possible to implement one or more other electrically conductive interconnect bodies in the package, for instance a bond wire and/or a bond ribbon connecting the electronic component with the carrier and/or a lead and/or a further electronic component and/or connecting different pads of an electronic component.

Figure 2:
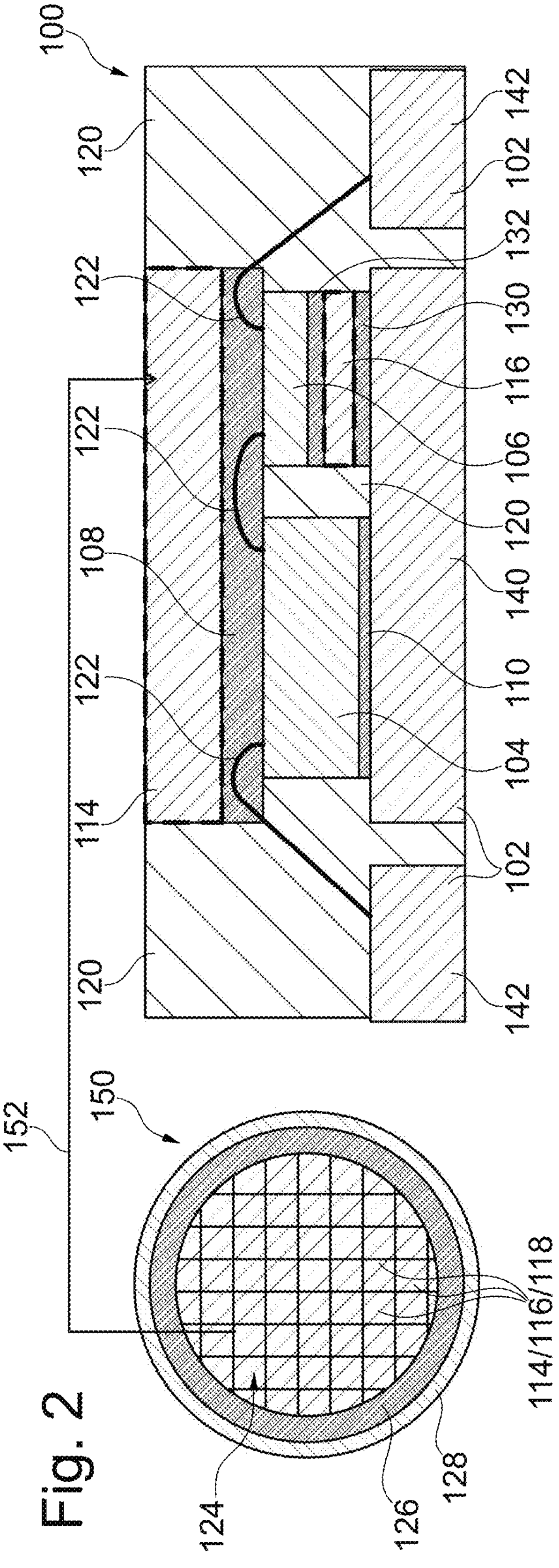
FIG. 2 illustrates a cross-sectional view of a package according to another exemplary embodiment.

In an embodiment, the at least one electrically conductive connection element extends partially through the electrically insulating and thermally conductive layer. Correspondingly, the method may comprise electrically connecting the at least one electrically conductive connection element to extend partially through the electrically insulating and thermally conductive layer. Such an embodiment is shown in FIG. 2. For example, a bond wire may be dissolved in a film forming the electrically insulating and thermally conductive layer. This may further improve heat dissipation.

In another embodiment, the at least one electrically conductive connection element extends entirely apart from (i.e. outside of) the electrically insulating and thermally conductive layer. Accordingly, the method may comprise electrically connecting the at least one electrically conductive connection element to extend entirely apart from the electrically insulating and thermally conductive layer. A corresponding embodiment is illustrated in FIG. 1. Keeping the at least one electrically conductive connection element outside of the electrically insulating and thermally conductive layer may lead to a particularly simple manufacturing process.

In an embodiment, the metal block is configured to be thermally functional and electrically non-functional. In other words, the metal block may be connected in the package so that it forms part of a continuous thermally conductive path from the electronic component up to an exterior of the package and thereby contributes to heat dissipation and consequently cooling. In the described embodiment, the metal block may however be electrically decoupled from all current carrying members of the package, in particular from the at least one electronic component and preferably also from the carrier.

In an embodiment, the carrier is configured to be electrically functional, and optionally to be thermally functional. At least a portion of the carrier may thus have an electric function in terms of the overall functionality of the package. Thus, electric current may flow through at least part of the carrier during operation of the package. For this purpose, the at least partially electrically conductive carrier may also be electrically coupled with the at least one electronic component of the package. Optionally and preferably, the carrier may also contribute to the heat removal from the package during operation. This may be accomplished by thermally coupling a bottom side of the electronic component with the carrier (for example by yet another electrically insulating and thermally conductive layer in between) and/or by exposing a surface portion of the carrier with respect to the encapsulant.

In an embodiment, the electrically insulating and thermally conductive layer and the metal block have another, in particular a smaller or a larger, lateral extension than the electronic component. Referring for example to the embodiment of FIG. 1, a main surface of the electrically insulating and thermally conductive layer and of the thermal block may be smaller than a lateral extension of the connected electronic component. Consequently, only a portion of a main surface of the electronic component will then be covered by the electrically insulating and thermally conductive layer and the metal block. A remaining, uncovered portion of the upper main surface of the electronic component may then be used for connecting at least one electrically conductive connection element (such as a bond wire). This design may simplify the electric interconnection of the electronic component inside of the package. In alternative embodiments (see for example FIG. 2) the electrically insulating and thermally conductive layer as well as the metal block may extend laterally beyond the main surface of the respective electronic component, i.e. may be larger. Thus, not only the entire main surface of the electronic component may then be covered by the electrically insulating and thermally conductive layer, but the latter may also laterally protrude beyond the electronic component. This may ensure an excellent heat removal capability and may also promote heat spreading. Thus, the latter embodiment may be particularly advantageous for further enhancing the thermal performance.

In an embodiment, the electronic component comprises one of the group consisting of a power semiconductor chip and a microcontroller. In such applications, a high amount of heat will be created by the encapsulated electronic component(s) during operation of the package. Thus, the improved thermal performance thanks to the provision of the electrically insulating and thermally conductive layer on top of the electronic component as well as due to the partially exposed metal block will be of utmost advantage in such embodiments.

In an embodiment, the electronic component is configured as leadless package. A leadless package may be denoted as a package in which leads for electrically connecting an encapsulated electronic component do not extend beyond an encapsulant as exposed strips or legs, but are only accessible from an exterior of the package as planar surfaces being for instance aligned (in particular horizontally and/or vertically) with an exterior surface of the encapsulant. While leaded packages have exposed legs around the perimeter of a component for connection to a mounting base such as a printed circuit board, leadless packages only expose leads as contact points or areas (rather than protrusions) in alignment with the encapsulant.

In an embodiment, the method comprises providing a metal plate, separating the metal plate into a plurality of metal blocks, and placing at least one separated metal block above and/or below the electronic component. Advantageously, the described configuration allows a simple batch manufacture of a plurality of metal blocks for assembly on electronic components or carriers of multiple preforms of packages. For example, a metal plate (such as a copper plate) may be provided, for instance with circular or rectangular shape. The metal plate may then be separated (preferably by mechanically cutting or laser cutting, or alternatively by etching) into a plurality of metal blocks. For instance, the metal plate may be separated along straight separation lines extending along two perpendicular directions. For example, the metal plate may be separated into individual metal blocks by cutting along the rows and columns, i.e. in a matrix-like manner.

In an embodiment, the method comprises connecting a metal plate with an electrically insulating and thermally conductive sheet, and separating the metal plate together with the electrically insulating and thermally conductive sheet into a plurality of metal blocks each having an electrically insulating and thermally conductive layer thereon. Said electrically insulating and thermally conductive sheet may be sticky or adhesive. For example, it may then be possible to place a separated metal block with electrically insulating and thermally conductive layer thereon on the electronic component (or on the carrier) so that the electrically insulating and thermally conductive layer is arranged on said at least part of the upper main surface of the electronic component (or on the carrier). Highly advantageously, the above-mentioned metal plate may be connected with an electrically insulating and thermally conductive sheet, for instance having the same dimensions. The separation process of the metal plate may then separate also the electrically insulating and thermally conductive sheet to thereby form a plurality of stacked double structures of an electrically insulating and thermally conductive layer and a metal block thereon. Such a pre-fabricated double-structure may then be placed on the electronic component (or the carrier). The described manufacturing process is highly efficient and allows to manufacture packages with high throughput on an industrial scale.

In an embodiment, the method comprises arranging the metal plate and/or the electrically insulating and thermally conductive sheet on a support structure, in particular a support ring, prior to said placing, in particular prior to said separating. For example, the support ring may be a wafer ring on which a die attach foil tape may be mounted. A copper plate may then be applied on the die attach foil tape. The obtained arrangement can be sawn for separating the metal plate with electrically insulating and thermally conductive sheet beneath. Thereafter, double structures, each containing a respective electrically insulating and thermally conductive layer and an assigned metal block thereon, may then be assembled on an electronic component or on a carrier in a pick and place fashion. In the readily manufactured package, a double structure composed of electrically insulating and thermally conductive layer and assigned metal block thereon may have the same dimensions and the same outline in a horizontal plane.

In an embodiment, the method comprises, before mounting the electrically insulating and thermally conductive layer and the metal block on the electronic component, electrically connecting at least one electrically conductive connection element (such as a bond wire or a clip) between the upper main surface of the electronic component on the one hand and the carrier and/or a further electronic component on the other hand. To simplify the manufacturing process, it may be preferred to firstly connect electrically conductive connection elements between electronic component and carrier and/or between different electronic components before mounting a stack of an electrically insulating and thermally conductive layer and a metal block thereon.

In an embodiment, the package is configured as power package. A power package may be a package comprising at least one power chip as encapsulated electronic component. Thus, the package may be configured as power module, for instance molded power module such as a semiconductor power package. For instance, an exemplary embodiment of the package may be an intelligent power module (IPM). Another exemplary embodiment of the package is a dual inline package (DIP).

Correspondingly, the electronic component may be configured as a power semiconductor chip. Thus, the electronic component (such as a semiconductor chip) may be used for power applications for instance in the automotive field and may for example have at least one integrated insulated-gate bipolar transistor (IGBT) and/or at least one transistor of another type (such as a MOSFET, a JFET, a HEMT, etc.) and/or at least one integrated diode. Such integrated circuit elements may be manufactured for instance in silicon technology or based on wide-bandgap semiconductors (such as silicon carbide, gallium nitride). A semiconductor power chip may comprise one or more field effect transistors, diodes, inverter circuits, half-bridges, full-bridges, drivers, logic circuits, further devices, etc. Advantages of exemplary embodiments concerning electric isolation and thermal dissipation are particularly pronounced for power dies.

In an embodiment, the package comprises a heat sink mounted on a portion of the encapsulant and on the exposed surface of the metal block(s). Such a heat sink may be a heat dissipation body, which may be made of a highly thermally conductive material such as copper or aluminum which may be attached to the encapsulant surface and the exposed metal block. For instance, such a heat sink may have a base body being directly connected to said surface of the encapsulant and of the exposed metal block and may have a plurality of cooling fins extending from the base body and in parallel to each another so as to remove the heat towards the environment.

In an embodiment, the package is configured as one of the group consisting of a leadframe connected power module, a Control integrated power system (CIPOS) package, a Transistor Outline (TO) package, a Quad Flat No Leads Package (QFN) package, a Small Outline (SO) package, a Small Outline Transistor (SOT) package, and a Thin Small Outline Package (TSOP) package. For example, the package may be implemented in a "CIPOS™ Mini" configuration or a "TO-247" configuration of the applicant Infineon Technologies AG. Also packages for sensors and/or mechatronic devices are possible embodiments. Moreover, exemplary embodiments may also relate to packages functioning as nano-batteries or nano-fuel cells or other devices with chemical, mechanical, optical and/or magnetic actuators. Therefore, the package according to an exemplary embodiment is fully compatible with standard packaging concepts and appears externally as a conventional package, which is highly user convenient.

As substrate or wafer forming the basis of the electronic components, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

In conventional packages, insufficient heat dissipation may occur which may reduce the thermal performance of the package. In particular in multi-chip applications with different die heights, manufacturing issues may occur in particular in a wire bond process.

According to an exemplary embodiment, a package is provided which comprises a carrier (for instance of a leadframe type) and one or more electronic components (such as at least one semiconductor chip) mounted on the carrier or above the carrier. Advantageously, an electrically insulating and thermally conductive layer (for instance a thermally enhanced die attach film) may cover an upper main surface of the electronic component at least partially and may therefore ensure a proper thermal coupling of the electronic component at its top side. In addition, a highly thermally conductive metal block (for instance made of copper) may be arranged on the electrically insulating and thermally conductive layer for continuing a thermally conductive path from the electronic component via the electrically insulating and thermally conductive layer through the metal block in an upward direction. An encapsulant (such as a mold compound) may encapsulate the mentioned constituents of the package at least partially while ensuring that an upper main surface of the metal block remains uncovered from the encapsulant material. Consequently, heat may be removed efficiently from the top side of the encapsulated electronic component up to an exterior of the package. At the same time, the dielectric property of the electrically insulating and thermally conductive layer may reliably electrically decouple the encapsulated electronic component from the exposed metallic surface of the package on the top side. This may lead to an excellent thermal and electric performance of the package.

In particular, an exemplary embodiment provides a method of manufacturing a package (preferably, but not necessarily a QFN package) with an encapsulated semiconductor chip-type electronic component. A metal block, which may be part of a sawn copper plate, in combination with an electrically insulating and thermally conductive layer, which may be part of a die attach film (DAF), may be mounted on top of the electronic component in the package. The copper plate and the die attach film may be processed in wafer form. The electronic component may be assembled in a bond die fashion on top of a carrier which may be embodied as a leadframe-type die paddle. For example, die attach equipment may be used for this assembly process.

A technical implementation of an exemplary embodiment may use a pick and place configuration based on a copper plate and a DAF using die attach equipment, which may be separated together into individual electrically insulating and thermally conductive layers with respective metal block thereon. Such pre-assembled double structures may be assembled on top of an already mounted electronic component or on a leadframe-type die paddle of the carrier. By such a double structure mounted directly on a carrier, it may be possible to raise the height for a thinner die in a multi-die package. The electronic component may be assembled as wire bonded die. A metal block (preferably of copper) being spaced with respect to the electronic component by the electrically insulating and thermally conductive layer may be exposed after encapsulation (preferably by molding). This may enable top sided cooling. When exposing also a bottom surface and/or a lateral surface of the carrier, double sided cooling may be achieved. This may lead to a package having a proper thermal and electric performance.

The provision of an additional metal block between the carrier and the electronic component may allow to flexibly increase a vertical level for a thinner die of a multi-die package. Consequently, all dies of the multichip package may have the same top die level. This may reduce process complication, in particular during wire bonding. Also a floating clip approach may be carried out.

FIG. 1 illustrates, on the right-hand side, a cross-sectional view of a package 100 according to an exemplary embodiment. As shown, package 100 is configured as leadless package. On the left-hand side of FIG. 1, a plan view of an arrangement 150 is shown which comprises a separated metal plate 124 on an electrically insulating and thermally conductive sheet 126, both held on an annular support structure 128.

Referring to the right-hand side of FIG. 1, the illustrated package 100 comprises a metallic carrier 102 (for instance made of copper). The illustrated planar carrier 102 can be embodied as a leadframe-type carrier. The carrier 102 comprises a die paddle 140 surrounded by and separated from a plurality of separate leads 142.

An electronic component 104, which may be embodied as a semiconductor chip (for instance a semiconductor power chip), is mounted on the die paddle 140 of the carrier 102.

As shown, an electrically insulating and thermally conductive layer 108 is arranged on only part of an upper main surface of the electronic component 104. Moreover, package 100 comprises another thermally conductive layer 110 on the entire lower main surface of the electronic component 104. Each of the thermally conductive layers 108, 110 may be an adhesive material having a thermal conductivity of preferably at least 1 W/mK, more preferably at least 2 W/mK, most preferably at least 5 W/mK.

A metal block 114, for instance made of copper or aluminum, is arranged on top of the electrically insulating and thermally conductive layer 108. The metal block 114 and the electrically insulating and thermally conductive layer 108 may be a stacked double layer having the same dimensions and outline in a horizontal plane. This is the result of a manufacturing process of said double layer which will be explained below referring to arrangement 150.

Thanks to the described double layer on top of the electronic component 104, a thermally conductive path from a top side of the electronic component 104 up to an exterior upper main surface of the package 100 is formed. Moreover, a further thermally conductive path is formed from a bottom side of the electronic component 104 through the other thermally conductive layer 110 and the die paddle 140 of the carrier 102 up to an exterior bottom main surface of the package 100. Advantageously, this leads to a double sided cooling of the electronic component 104 and thus an excellent thermal performance of package 100.

Apart from this, a further electronic component 106, which may be another semiconductor chip (for instance a semiconductor power chip), is mounted above the die paddle 140 of the carrier 102. As shown, electronic component 104 has a vertical thickness D being larger than a vertical thickness d of the further electronic component 106. A further electrically insulating and thermally conductive layer 112 is formed on part of an upper main surface of the further electronic component 106. Beyond this, still another thermally conductive layer 132 is arranged on an entire bottom main surface of the further electronic component 106. Each of the thermally conductive layers 112, 132 may be an adhesive material having a thermal conductivity of preferably at least 1 W/mK, more preferably at least 2 W/mK, most preferably at least 5 W/mK.

Additionally, a further metal block 118, for example made of copper or aluminum, is arranged on the further electrically insulating and thermally conductive layer 112. The further metal block 118 and the further electrically insulating and thermally conductive layer 112 may be a stacked double layer having the same dimensions and outline in a horizontal plane. This is the result of a manufacturing process of said double layer which will be explained below referring to arrangement 150.

Unlike electronic component 104, further electronic component 106 has an additional stack below. Said stack is composed of another metal block 116 and still another thermally conductive layer 130 on the entire bottom main surface of the other metal block 116. The other thermally conductive layer 130 may be embodied as described for the thermally conductive layers 108, 110, 112, 132. The other metal block 116, for instance made of copper or aluminum, is arranged between the die paddle 140 of the carrier 102 and the further electronic component 106. A thickness b of the other metal block 116 can be selected for leveling a height difference D-d between the electronic component 104 and the further electronic component 106. A skilled person will however understand that the thicknesses of the involved thermally conductive layers 108, 110, 112, 130, 132 and/or the thicknesses of the metal blocks 114, 118 may also have an impact on height leveling and may be adjusted accordingly. To put it shortly, the various thicknesses may be adjusted so that a stack extending vertically from the upper main surface of the die paddle 140 of the carrier 102 up to the exposed upper main surface of metal block 114 has a thickness L being the same or substantially the same as a thickness 1 of another stack extending vertically from the upper main surface of the die paddle 140 of the carrier 102 up to the exposed upper main surface of further metal block 118.

Due to the mentioned double layer on top of the further electronic component 106, a thermally conductive path from a top side of the further electronic component 106 up to an exterior upper main surface of the package 100 is formed. Moreover, a further thermally conductive path is formed from a bottom side of the further electronic component 106 through the further thermally conductive layer 132, the other metal block 116, the still other thermally conductive layer 130 and the die paddle 140 of the carrier 102 up to an exterior lower main surface of the package 100. Advantageously, this leads to a double sided cooling of the further electronic component 106 and thus an excellent thermal performance of package 100.

FIG. 1 also shows an encapsulant 120, which may be embodied as a mold compound. The encapsulant 120 may thus be formed by molding and may encapsulate the electronic component 104, part of the carrier 102, the thermally conductive layers 108, 110 and part of the metal block 114. Correspondingly, the encapsulant 120 encapsulates the further electronic component 106, the further thermally conductive layers 112, 130, 132, the other metal block 116 and part of the further metal block 118.

Encapsulation of the metal block 114 and of the further metal block 118 is however incomplete so that an upper main surface of the metal block 114 and an upper main surface of the further metal block 118 are exposed beyond the encapsulant 120. This promotes cooling of the top side of the electronic components 104, 106. As shown in FIG. 1 as well, a lower main surface of the die paddle 140 and a side surface of the leads 142 of the carrier 102 are exposed beyond the encapsulant 120. This has an additional positive impact on heat removal from a bottom surface of the electronic components 104, 106.

As shown as well in FIG. 1, package 100 additionally comprises a plurality of electrically conductive connection elements 122, which are here embodied as bond wires. Some of the electrically conductive connection elements 122 electrically connect the upper main surface of the electronic components 104, 106 with respective leads 142 of the carrier 102. Another electrically conductive connection element 122 electrically connects electronic component 104 with further electronic component 106. In the shown embodiment, the electrically conductive connection elements 122 extend entirely through encapsulant 120 and thus apart from or outside of the electrically insulating and thermally conductive layers 108, 112.

According to FIG. 1, each of the metal block 114 and the further metal block 118 is configured to be thermally functional and electrically non-functional. As described above, metal blocks 114, 118, together with electrically insulating and thermally conductive layers 108, 112, contribute to heat removal from the top sides of the encapsulated electronic components 104, 106 and are thus thermally functional. However, due to the dielectric property of the electrically insulating and thermally conductive layers 108, 112, metal blocks 114, 118 are electrically decoupled from the electrically functional electronic components 104, 106 and are therefore electrically non-functional. Due to the electric coupling of the leads 142 of the carrier 102 with the electronic components 104, 106 by some of the electrically conductive connection elements 122, the carrier 102 is configured to be electrically functional. Due to the thermal coupling of the electronic components 104, 106 by the thermally conductive layers 110, 130, 132 and the other metal block 116 with the die paddle 140 of the carrier 102, the carrier 102 is also connected to be thermally functional.

Since, according to FIG. 1, the electrically insulating and thermally conductive layer 108 and the metal block 114 have a smaller lateral extension than the electronic component 104, formation of the bond wire-type electrically conductive connection elements 122 may be simplified. Correspondingly, formation of the bond wire-type electrically conductive connection elements 122 may be simplified, since the further electrically insulating and thermally conductive layer 112 and the further metal block 118 have a smaller lateral extension than the further electronic component 106.

Now referring to arrangement 150, the illustrated metal plate 124 (such as a copper plate) on the electrically insulating and thermally conductive sheet 126 (such as a die attach film (DAF) tape) may be separated simultaneously or together when mounted on the annular support structure 128. For example, this can be accomplished by sawing along horizontal and vertical straight sawing lines. As a result, a plurality of individually pickable double layer structures may be obtained, each comprising a respective metal block 114/116/118 on a respective electrically insulating and thermally conductive layer 108/112/130. By a pick and place arrangement which is indicated schematically by reference sign 152 in FIG. 1, a respective double layer structure may be picked from annular support ring 128 and may be placed on carrier 102 or on a respective electronic component 104, 106 for manufacturing the package 100 with low effort, high speed and in a failure robust way.

Any of the thermally conductive layers 110, 130 and 132 of the embodiment of FIG. 1 or of any other embodiment can be electrically insulating and thermally conductive materials, for example may be made of the same material as layer(s) 108 and/or 112. It is also possible that any of the thermally conductive layers 110, 130 and 132 can be electrically and thermally conductive materials, for instance soft solder, solder paste, lead-free solder or diffusion soldering material, which connect chip electrodes to the carrier 102 (for example a leadframe) or metal block 116. Layer 110 can be adhesive under electronic component 104. Furthermore, layer 132 can be adhesive under further electronic component 106. Layer 130 can be adhesive under metal block 116. Thermal conductivity of any of the thermally conductive layers 108, 110, 112, 130 and 132 can be preferably at least 1 W/mK, more preferably at least 2 W/mK, most preferably at least 5 W/mK.

FIG. 2 illustrates a cross-sectional view of a package 100 according to another exemplary embodiment.

The embodiment according to FIG. 2 differs from the embodiment according to FIG. 1 in particular in that, according to FIG. 2, the electrically insulating and thermally conductive layer 108 is arranged on the entire upper main surface of the electronic component 104 and on the entire upper main surface of the further electronic component 106. Correspondingly, the metal block 114 has the same horizontal dimensions and outline as the electrically insulating and thermally conductive layer 108 and thereby also covers the entire spatial range of the electronic component 104 and the further electronic component 106. This further improves the heat removal capability from the top side of the electronic components 104, 106. Furthermore, this may simplify the manufacturing process, since the number of double structures composed of a metal block and an electrically insulating and thermally conductive layer to be handled during the manufacturing process of the package 100 may be further reduced as compared with FIG. 1.

A further difference between the embodiment of FIG. 2 and the embodiment of FIG. 1 is that, according to FIG. 2, the electrically conductive connection elements 122 extend partially through the electrically insulating and thermally conductive layer 108 and partially through the encapsulant 120. By guiding the electrically conductive connection elements 122 partially through the electrically insulating and thermally conductive layer 108, the heat removal capability may be further improved.

In particular, metal block 114 of FIG. 2 may be embodied as a large copper plate having on its bottom side the electrically insulating and thermally conductive layer 108 which may be embodied as a film on wire (FOW) tape. The latter can be applied as illustrated in FIG. 2 with further exposed cooling area to further improve the thermal dissipation efficiency.

Figure 3:
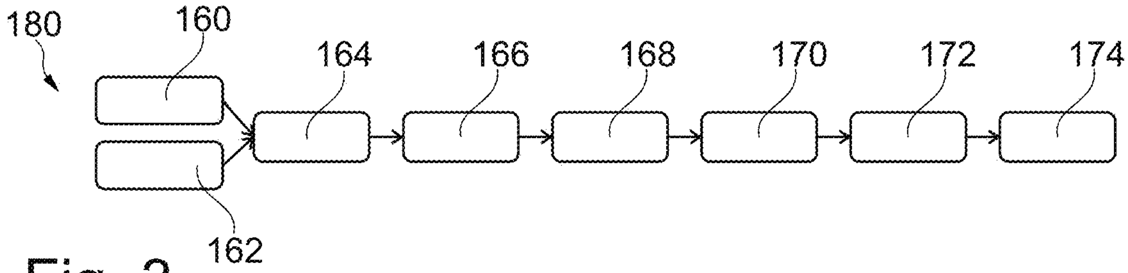
FIG. 3 illustrates a flowchart of a method of manufacturing a package according to an exemplary embodiment.

FIG. 3 illustrates a flowchart 180 of a method of manufacturing a package according to an exemplary embodiment.

Referring to a block 160, a pre-assembly of electronic components, preferably embodied as integrated circuit (IC) chips, may be created.

Referring to a block 162, a pre-assembly of metal blocks, preferably formed based on a copper plate, may be created.

Referring to a block 164, a bonding process may be executed for bonding metal blocks with attached electrically insulating and thermally conductive layer.

Referring to a block 166, die bonding of the IC-type electronic components may be executed.

Referring to a block 168, a glue curing process may be carried out.

Referring to a block 170, wire bonding may be executed for forming electrically conductive connection elements.

Referring to a block 172, a further bonding process may be executed for bonding metal blocks with attached electrically insulating and thermally conductive layer.

Referring to a block 174, end of the line (EOL) processes may be executed, such as molding, plating, singulation.

Figure 4:
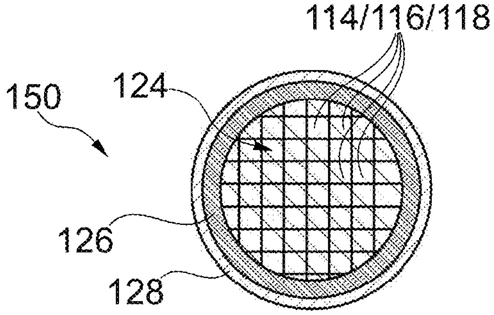
FIG. 4 illustrates a plan view of a separated metal plate used for manufacturing packages according to an exemplary embodiment.

FIG. 4 illustrates a plan view of a separated metal plate 124 used for manufacturing packages 100 according to an exemplary embodiment.

Also referring to the description of the arrangement 150 in FIG. 1, a metal plate 124 may be provided, for instance a copper plate. The metal plate 124 may be connected with an adhesive electrically insulating and thermally conductive sheet 126 beneath. The metal plate 124 and the electrically insulating and thermally conductive sheet 126 may be arranged on a support structure 128, preferably a support ring. Thereafter, the metal plate 124 may be separated together with the electrically insulating and thermally conductive sheet 126 into a plurality of metal blocks 114/116/118 each having an electrically insulating and thermally conductive layer 108/130/112 thereon. Each separated metal block 114/116/118 with electrically insulating and thermally conductive layer 108/130/112 thereon may be placed above and/or below an assigned electronic component 104/106.

Figure 9:
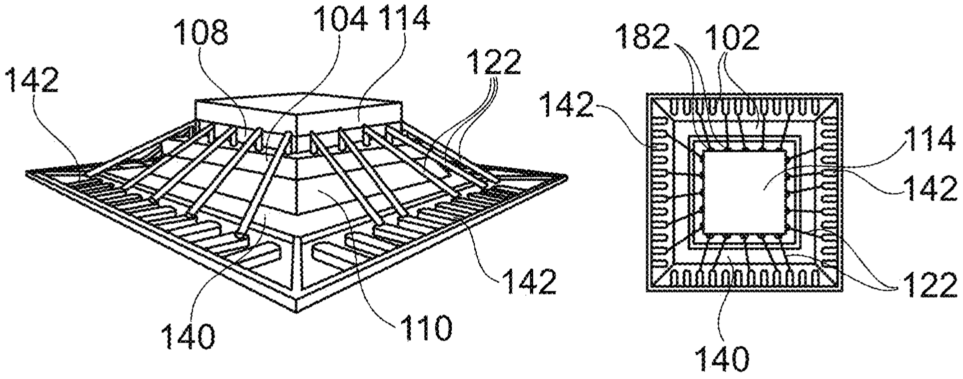
Figure 10:
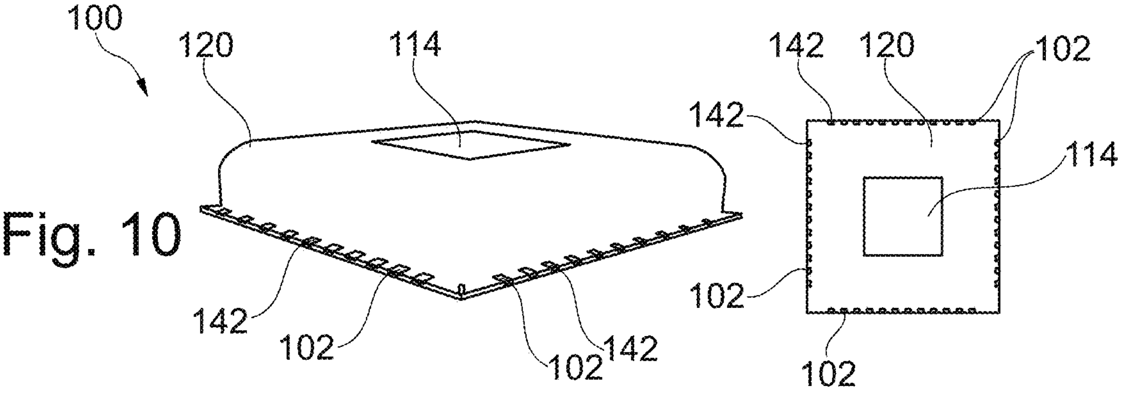
Figure 11:
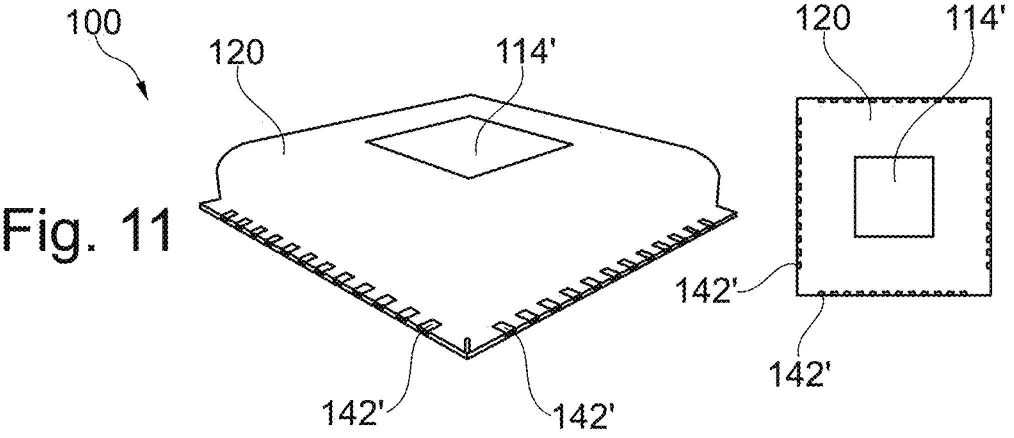

FIG. 5 to FIG. 11 illustrate three-dimensional views and plan views of structures obtained during carrying out a method of manufacturing a package 100, shown in FIG. 11, according to an exemplary embodiment. More specifically, a three-dimensional view of the respective structure is show on the left-hand side, whereas the corresponding plan view is shown on the right-hand side.

Figure 5:
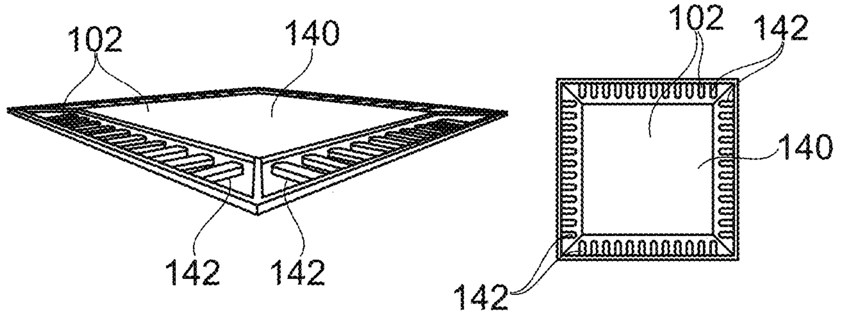
FIG. 5 to FIG. 11 illustrate three-dimensional views and plan views of structures obtained during carrying out a method of manufacturing a package, shown in FIG. 11, according to an exemplary embodiment.

Referring to FIG. 5, a metallic leadframe-type carrier 102 with central die paddle 140 and circumferentially surrounding leads 142 (or pads) is shown. More specifically, leads 142 may be foreseen at each of four surrounding edges of the rectangular die paddle 140.

Figure 6:
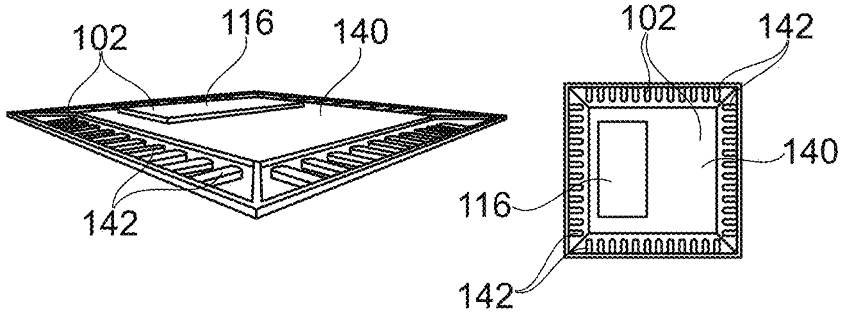

Referring to FIG. 6, a height leveling metal block 116 may be optionally assembled to a portion of an upper main surface of the die paddle 140 of the carrier 102. A thermally conductive layer, see reference sign 130 in FIG. 1 or FIG. 2, may be arranged between the metal block 116 and the carrier 102 (not shown in FIG. 6).

Figure 7:
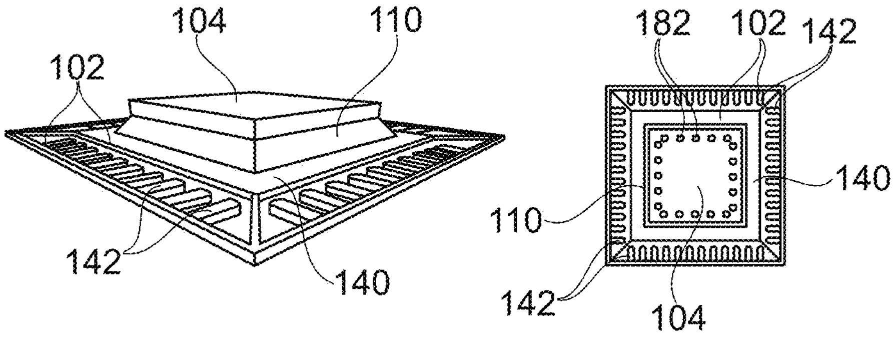

Referring to FIG. 7, electronic component 104 is mounted or assembled on the die paddle 140 of the carrier 102. Electronic component 104 has, at its bottom side, a die attach film as thermally conductive layer 110. A glue of the latter may be cured after assembly. On the top side of the electronic component 104, one or more electrically conductive chip pads 182 may be exposed.

Figure 8:
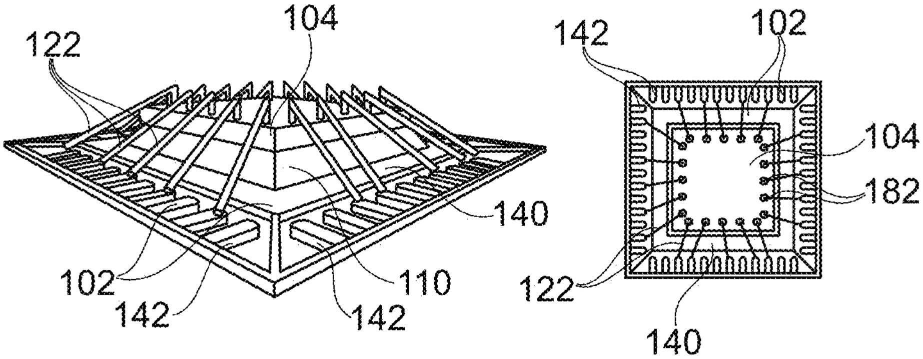

Referring to FIG. 8, electrically conductive connection elements 122, here embodied as bond wires, are then electrically and mechanically connected between the pads 182 on the upper main surface of the electronic component 104 on the one hand and the leads 142 of the carrier 102 on the other hand. To put it shortly, wire bonding is executed according to FIG. 8.

Referring to FIG. 9, a double structure composed of a top sided metal block 114 and a bottom-sided electrically insulating and thermally conductive layer 108 is attached to an upper main surface of the electronic component 104 inside of the circumferentially arranged pads 182. Said double structure may be denoted as copper plate-die attach film-stack.

Referring to FIG. 10, the structure shown in FIG. 9 is partially encapsulated by molding. However, surface areas of the leads 142, a bottom surface portion of the die paddle 140 and a top surface of the metal block 114 are exposed beyond encapsulant 120, which may be a mold compound. The mentioned exposed portions may be exposed right after molding. Optionally, a mold deflash process may be executed for removing residues of encapsulant 120 which may still cover parts of said portions.

Referring to FIG. 11, the exposed metallic surfaces of the structure shown in FIG. 10 may be subjected to surface finishing or surface protection. Hence, the exposed surface of the metal block 114 may be provided with a surface plating 114'. Correspondingly, the exposed surface of the leads 142 may be provided with a surface plating 142', etc. For example, the respective surface plating may protect the respective surface (of copper) from oxidation. For instance, this can be accomplished by surface plating with tin.

It should be noted that the term “comprising” does not exclude other elements or features and the “a” or “an” does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:

a carrier;

an electronic component mounted on or above the carrier;

an electrically insulating and thermally conductive dielectric layer on at least part of an upper main surface of the electronic component;

a metal block on the electrically insulating and thermally conductive layer; and an encapsulant at least partially encapsulating the electronic component, the carrier, the electrically insulating and thermally conductive layer and the metal block so that an upper main surface of the metal block is exposed beyond the encapsulant;

a further electronic component mounted on or above the carrier;

a further electrically insulating and thermally conductive layer on at least part of an upper main surface of the further electronic component;

a further metal block on the further electrically insulating and thermally conductive layer;

wherein the encapsulant at least partially encapsulates the further electronic component, the further electrically insulating and thermally conductive layer and the further metal block so that an upper main surface of the further metal block is exposed beyond the encapsulant; and comprising another metal block between the carrier and the further electronic component for at least partially leveling a height difference between the electronic component and the further electronic component.

2. The package according to claim 1, comprising still another at least one thermally conductive layer between the carrier and the other metal block and/or between the other metal block and the further electronic component.

3. The package according to claim 1, comprising at least one electrically conductive connection element electrically connecting the upper main surface of the electronic component with the carrier and/or with the further electronic component of the package.

4. A package, comprising:

a carrier;

an electronic component mounted on or above the carrier;

an electrically insulating and thermally conductive layer on at least part of an upper main surface of the electronic component;

a metal block on the electrically insulating and thermally conductive layer;

an encapsulant at least partially encapsulating the electronic component, the carrier, the electrically insulating and thermally conductive layer and the metal block so that an upper main surface of the metal block is exposed beyond the encapsulant;

at least one electrically conductive connection element electrically connecting the upper main surface of the electronic component with the carrier and/or with a further electronic component of the package; and comprising one of the following features:

wherein the at least one electrically conductive connection element extends partially through the electrically insulating and thermally conductive layer;

wherein the at least one electrically conductive connection element extends entirely apart from the electrically insulating and thermally conductive layer.

5. The package according to claim 4, wherein a lower main surface and/or a side surface of the carrier is exposed beyond the encapsulant.

6. The package according to claim 4, comprising another thermally conductive layer on at least part of a lower main surface of the electronic component.

7. The package according to claim 4, comprising the further electronic component mounted on or above the carrier;

wherein the electrically insulating and thermally conductive layer is arranged on at least part of an upper main surface of the further electronic component; and wherein the encapsulant at least partially encapsulates the further electronic component.

8. The package according to claim 4, wherein the metal block is configured to be thermally functional and electrically non-functional.

9. The package according to claim 4, wherein the carrier is configured to be electrically functional, and optionally to be thermally functional.

10. The package according to claim 4, wherein the electrically insulating and thermally conductive layer and the metal block have another, in particular a smaller or a larger, lateral extension than the electronic component.

11. The package according to claim 4, comprising at least one of the following features:

wherein the electronic component comprises one of the group consisting of a power semiconductor chip and a microcontroller;

the package is configured as leadless package.

12. A method of manufacturing a package, the method comprising:

mounting an electronic component on or above a carrier;

providing an electrically insulating and thermally conductive dielectric layer on at least part of an upper main surface of the electronic component;

providing a metal block on the electrically insulating and thermally conductive layer; and at least partially encapsulating the electronic component, the carrier, the electrically insulating and thermally conductive layer and the metal block by an encapsulant so that an upper main surface of the metal block is exposed beyond the encapsulant;

wherein the method comprises:

mounting another metal block with at least one other thermally conductive layer thereon and/or thereunder on the carrier;

mounting a further electronic component on or above the other metal block; and selecting the other metal block with the at least one other thermally conductive layer thereon and/or thereunder for leveling a height difference between the electronic component and the further electronic component.

13. A method of manufacturing a package, the method comprising:

mounting an electronic component on or above a carrier;

providing an electrically insulating and thermally conductive dielectric layer on at least part of an upper main surface of the electronic component;

providing a metal block on the electrically insulating and thermally conductive layer; and at least partially encapsulating the electronic component, the carrier, the electrically insulating and thermally conductive layer and the metal block by an encapsulant so that an upper main surface of the metal block is exposed beyond the encapsulant;

wherein the method comprises, before mounting the electrically insulating and thermally conductive layer and the metal block on the electronic component, electrically connecting at least one electrically conductive connection element between the upper main surface of the electronic component on the one hand and the carrier and/or a further electronic component on the other hand;

wherein the method comprises one of the following features:

electrically connecting the at least one electrically conductive connection element to extend partially through the electrically insulating and thermally conductive layer;

electrically connecting the at least one electrically conductive connection element to extend entirely apart from the electrically insulating and thermally conductive layer.

14. The method according to claim 13, wherein the method comprises:

providing a metal plate;

separating the metal plate into a plurality of metal blocks; and placing at least one separated metal block above and/or below the electronic component.

15. The method according to claim 13, wherein the method comprises:

connecting a metal plate with an electrically insulating and thermally conductive sheet;

separating the metal plate together with the electrically insulating and thermally conductive sheet into a plurality of metal blocks each having an electrically insulating and thermally conductive layer thereon; and placing a separated metal block with electrically insulating and thermally conductive layer thereon on the electronic component so that the electrically insulating and thermally conductive layer is arranged on said at least part of the upper main surface of the electronic component.

16. The method according to claim 14, wherein the method comprises arranging the metal plate and/or the electrically insulating and thermally conductive sheet on a support structure.

* * * * *